(12) United States Patent
Rupp et al.

(10) Patent No.: US 11,757,447 B2
(45) Date of Patent: Sep. 12, 2023

(54) SENSOR ELEMENT DEVICE FOR AN OPERATING DEVICE, OPERATING DEVICE AND ELECTRICAL APPLIANCE HAVING SUCH AN OPERATING DEVICE

(71) Applicant: E.G.O. Elektro-Geraetebau GmbH, Oberderdingen (DE)

(72) Inventors: Michael Rupp, Eppingen (DE); Dennis Schmid, Kraichtal (DE); Siegbert Wein, Kraichtal (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 705 days.

(21) Appl. No.: 16/908,847

(22) Filed: Jun. 23, 2020

(65) Prior Publication Data
US 2021/0010678 A1  Jan. 14, 2021

(30) Foreign Application Priority Data
Jul. 12, 2019 (DE) ...................... 10 2019 210 351.0

(51) Int. Cl.
*H03K 17/96* (2006.01)
*B23K 26/364* (2014.01)
(Continued)

(52) U.S. Cl.
CPC ......... *H03K 17/962* (2013.01); *B23K 26/364* (2015.10); *F24C 7/083* (2013.01);
(Continued)

(58) Field of Classification Search
CPC ............... H03K 17/955; H03K 17/962; H03K 2217/960785; H03K 2017/9602; H03K 2217/960755
(Continued)

(56) References Cited

U.S. PATENT DOCUMENTS 5,917,165 A  6/1999 Platt et al.
7,652,230 B2 * 1/2010 Baier ...................... D06F 34/28
                                                              219/508
(Continued)

FOREIGN PATENT DOCUMENTS

DE  102009036161 A1  2/2011
DE  102010033390 A1  2/2012
(Continued)

OTHER PUBLICATIONS

European Patent Office, Extended European Search Report for Application No. 20180470.5, dated Nov. 26, 2020, 8 pages, Germany.

*Primary Examiner* — Hai L Nguyen
(74) *Attorney, Agent, or Firm* — ALSTON & BIRD LLP

(57) ABSTRACT

A sensor element device for an operating device having a luminous display comprises a sensor element for a capacitive touch switch, a light guide for the luminous display, having an input region and an emission region, and light-nontransmissive shielding material which encloses the light guide except for the input region and the emission region. It furthermore comprises a lower side and an upper side, as well as at least one metallic sensor element. The sensor element extends from the lower side to the upper side. The sensor element device forms an integrated module with the light guide, shielding material and sensor element. The sensor element projects as far as a plane of the lower side. No part of the sensor element device protrudes downward.

17 Claims, 2 Drawing Sheets

(51) Int. Cl.
*F24C 7/08* (2006.01)
*G01D 5/24* (2006.01)

(52) U.S. Cl.
CPC .............. *F24C 7/086* (2013.01); *G01D 5/24* (2013.01); *H03K 2217/96079* (2013.01); *H03K 2217/960765* (2013.01); *H03K 2217/960785* (2013.01)

(58) Field of Classification Search
USPC ........................................................ 327/517
See application file for complete search history.

(56) References Cited

U.S. PATENT DOCUMENTS

| | | |
|---|---|---|
| 9,287,866 B2 | 3/2016 | Kleinhans |
| 10,788,932 B2 * | 9/2020 | Iuchi .................... G06F 3/04182 |
| 11,246,190 B2 * | 2/2022 | de Morais ............ H05B 6/1218 |

FOREIGN PATENT DOCUMENTS

| | | |
|---|---|---|
| DE | 102015214008 A1 | 1/2017 |
| EP | 2355356 A1 | 8/2011 |

* cited by examiner

SENSOR ELEMENT DEVICE FOR AN OPERATING DEVICE, OPERATING DEVICE AND ELECTRICAL APPLIANCE HAVING SUCH AN OPERATING DEVICE

CROSS-REFERENCE TO RELATED APPLICATIONS

This application claims priority to German Application No. 10 2019 210 351.0, filed Jul. 12, 2019, the contents of which are hereby incorporated herein in its entirety by reference.

APPLICATION FIELD AND PRIOR ART

The invention relates to a sensor element device for an operating device having a luminous display and a capacitive touch switch. The invention furthermore relates to an operating device having at least one such sensor element device and to an electrical appliance having such an operating device.

In an electric cooktop, it is known from U.S. Pat. No. 5,917,165 A1 to configure capacitive touch switches of an associated operating device with capacitive sensor elements, the cooktop plate being used as an operating surface. An electrically conductive resilient body is pressed onto the lower side of the cooktop plate at the operating surface. The electrically conductive upper side of this body forms the capacitive sensor element for the capacitive touch switch. On the inside, the body comprises a continuous light guide channel, in which an LED is arranged as a lighting means. The light of the latter shines through the cooktop plate from below and produces the luminous display.

A further sensor element device is known from DE 10 2015 214 008 A1, which may be integrated in a cooktop and with which both a luminous display and a capacitive touch switch may be obtained. In this case, light-nontransmissive shielding material is injection-molded around a light guide body, both being electrically insulating. A stamped and repeatedly bent metal part forms the capacitive sensor element and is provided on the upper side and downward on two opposite outer sides. On the lower side, two elongate pins protrude downward from the shielding material beyond the lower side. The sensor element device may thereby be fastened by means of an LED as lighting means on a printed circuit board.

OBJECT AND SOLUTION

The object of the invention is to provide a sensor element device as mentioned in the introduction, an operating device and an electrical appliance provided with such an operating device, with which problems of the prior art may be solved and, in particular, it is possible to configure a sensor element device simply and conveniently, and in particular to make it simply and reliably mountable for advantageous manufacturing of an operating device.

This object is achieved by a sensor element device having the features of claim 1, by an operating device having the features of claim 15 and by an electrical appliance having the features of claim 17. Advantageous and preferred configurations of the invention are the subject of the further claims and will be explained in more detail below. In this case, many of the features are described only for the sensor element device, only for the operating device or only for the electrical appliance. Regardless of this, it is intended that they may apply individually and independently of one another for a sensor element device as well as for an operating device and for an electrical appliance. The wording of the claims is included in the content of the description by explicit reference.

It is provided that the sensor element device comprises at least one sensor element, in order to form a capacitive touch switch which is then present on an operating device provided with the sensor element device. The sensor element device furthermore comprises a light guide, with which the luminous display is formed. The light guide consists of light-transmissive material, either transparent or translucent, or opaque for a more uniform light pattern. The light guide comprises an input region for light and an emission region for light. The sensor element device furthermore comprises shielding material, which encloses the light guide while substantially leaving only the input region and the emission region free. The shielding material is configured or selected in such a way that it is light-nontransmissive, or does not transmit light, either because it is fully light-nontransmissive material or because in combination with the light guide, particularly in the connecting surfaces, it does not transmit light, or reflects all light back into the light guide. The sensor element device comprises a lower side and an upper side, in particular when it has the shape of a cuboid or is configured as a cuboid, or in the manner of a block. In this case, the lower side and the upper side are correspondingly provided opposite one another on the cuboid shape or the block shape. The emission region of the light guide is advantageously provided close to the upper side or on the upper side. The input region is advantageously provided below the upper side, or a recess is provided there underneath on the sensor element device, in which recess a lighting means, for example an LED, may be accommodated so that at least a minimum separation from the input region is provided above it.

The sensor element device furthermore comprises at least one metallic sensor element as a component, which consists of at least one metal part. Advantageously, the sensor element device comprises one or two metal parts, which then together form the capacitive sensor element for a single touch switch of the sensor element device. To this end, they may advantageously be electrically connected. The sensor element extends from the lower side to the upper side, and advantageously forms the planes of the lower side and upper side or extends in these planes.

The sensor element device forms an integrated module with the light guide, the shielding material and the sensor element. It may advantageously be produced as an injection-molded part, which allows economical and precise production.

In this case, the sensor element, or said metal part, projects as far as a plane of the lower side of the sensor element device, so that it at least partially defines this plane, or extends therein. The same may also be provided on the upper side, although this is not necessary.

According to the invention, no part of the sensor element device protrudes downward beyond the lower side of the sensor element device or beyond the sensor element itself, or does not stand out downward. This ensures that, when placed on a planar surface with the sensor element, the sensor element device touches this planar surface or protrudes by at most 1 mm. With the invention, it is therefore possible to electrically connect the sensor element device well, simply and reliably in the long term. This electrical connection may simultaneously be a mechanical fastening. Above all, this electrical connection may preferably be configured as SMD connection, so that it may be produced very advantageously. In this case, it is also possible to achieve the effect that the sensor element device, and advantageously a plurality of sensor element devices with equivalent or identical design, can be placed by an SMD fitting machine in a known manner on a component carrier of the operating device.

In one advantageous configuration of the invention, the sensor element does not adjoin the light guide, or its light-transmissive material. It is regarded as advantageous for the sensor element to extend at a distance from the light guide, i.e. with a separation of at least 1 mm, so that the respective configuration may as far as possible be optimized for its function. This applies both for the light guide, or its shape formed with light-transmissive material, and for the sensor element. For the shielding material, this is significantly easier since it only has the purpose of being light-nontransmissive, or of not allowing light to emerge undesirably from the light guide. The shielding material thus advantageously extends at least partially between the light guide and the sensor element, or there is always shielding material between the light guide and the sensor element.

In a further configuration of the invention, it is possible for a sensor element, or the single sensor element, to extend on one side of the sensor element device. In particular, it may extend on an outer side, so that this side substantially adjoins the air or faces outward.

In an alternative configuration of the invention, in particular when a plurality of sensor elements are provided on a single sensor element device, it may be preferred for at least one sensor element to extend on at least two sides of the sensor element device. If only a single sensor element is provided on the sensor element device, these are advantageously two mutually adjacent sides, three mutually adjacent sides or possibly even all the mutually adjacent sides. As an alternative, at least two sensor elements which are at a distance from one another and separate may be provided on a single sensor element device, which are then advantageously provided on opposite sides. This respectively applies in particular for a cuboid shape or block shape of the sensor element device. If two sensor elements which are at a distance from one another and separate are provided, for manufacturing reasons and stock-keeping reasons, it is preferred for them to be mirror-symmetrically equivalent or even identical. In this case as well, it may advantageously be provided that all the sensor elements on a sensor element device are electrically interconnected with one another, or act by connection as a single capacitive sensor element, in order to form a capacitive touch switch.

Such integrally attached sensor elements, or the metal parts forming them, are advantageously bent or angled repeatedly. They may thus be adapted to the shape of the sensor element device, and in particular may also be configured for electrical contacting.

In one advantageous configuration of the invention, the sensor element device is produced by the injection-molding method, in particular by a multicomponent injection-molding method. In this case, the light guide and shielding material are advantageously injection-molded onto one another, the order being variable. Subsequently, the at least one metallic sensor element may be fastened on this component in order to form the sensor element device. As an alternative, the shielding material may also be injection-molded around the at least one sensor element, in particular together with the light guide. In this case, the at least one sensor element may be injection-molded on or at least partially around, so that it is connected stably and permanently to the sensor element device. In particular, however, the sensor element is not injection-molded around, or is exposed on the lower side of the sensor element device, and advantageously with a height of up to 2 mm or up to 3 mm beyond the lower side. This may be used for aforementioned electrical connection and mechanical connection, preferably by means of SMD soldering. The sensor element should also be exposed on the upper side, in order to be pressed directly onto a lower side of an operating surface of an operating device according to the invention. As an alternative, in this case a thin covering may also be provided above it, for example consisting of the shielding material, or alternatively of resilient silicone, or the like.

Bending of the sensor element in the region of the upper side and/or in the region of the lower side may be such that it is bent toward a central region of the side, i.e. not away from the sensor element device or the light guide, which advantageously extends approximately through the middle of the latter, but toward them. Bending may in this case be carried out approximately through a right angle, so that a bent section of the sensor element extends approximately parallel to and advantageously according to the upper side or the lower side, or respectively the plane thereof. For these bent sections of a sensor element, provision may also be made that a separation from the light guide is maintained.

In addition or as an alternative to an aforementioned covering above the sensor element device, which may for example consist of resilient silicone, provision may be made that a light-nontransmissive covering or coating is provided on the upper side of the entire sensor element device, or on the upper side of the light guide only, i.e. advantageously at the emission region. It is advantageously configured in such a way that it may be removed in a desired region in order to be able to display a symbol or sign illuminated in transmission, as is known per se from the prior art of such sensor element devices, see for example the aforementioned DE 10 2015 214 008 A1. Such a light-nontransmissive covering or coating may be configured to be relatively thin, it merely having to be light-nontransmissive, in particular for luminous intensities such as are conventionally used for an LED in operating devices for electrical appliances. One particularly advantageous possibility is a light-nontransmissive covering or coating which can be removed by a laser, so as to excavate a segment for transmission of light from the emission region. In this way, it is possible to provide not only an arbitrary or general luminous display, but also one in the shape of a symbol.

In one advantageous configuration of the invention, provision is made that precisely one sensor element device forms precisely one capacitive touch switch. In a similar way, it also forms precisely one single luminous display.

A sensor element may consist of a relatively thin metal, for example a copper sheet having a thickness of from 0.01 mm to 0.5 mm. On the upper side, it may be bent with a length of from 0.5 mm to 2 mm, so as to provide a certain area which, albeit small, is usually of great advantage for reliable function as a capacitive touch switch.

An operating device according to the invention advantageously comprises a component carrier, in particular a printed circuit board, on which a sensor element device is arranged and electrically connected. Advantageously, all the sensor element devices of the entire operating device are arranged and electrically connected on this component carrier. To this end, at least one contact field may be provided on the upper side, advantageously one contact field per individual sensor element part of the sensor element device. The sensor element device may be electrically connected and fastened thereon, advantageously by the aforementioned SMD soldering, or alternatively with a conductive adhesive.

Besides an electrical appliance according to the invention, which may be configured as an electric cooktop or hob, a cooktop plate forming the operating surface with one part, other electrical appliances, in particular electrical cooking appliances, may be provided with such an operating device according to the invention. These may be ovens, microwaves or steamers, but also other electrical appliances such as dishwashers or laundry machines.

These and other features are disclosed by the claims as well as by the description and the drawings; the individual features may in each case be implemented individually or jointly in the form of subcombinations in an embodiment of the invention and in other fields, and may represent advantageous and per se protectable embodiments for which protection is claimed here. The subdivision of the application into individual sections and subheadings does not restrict the statements made therein in their general applicability.

BRIEF DESCRIPTION OF THE DRAWINGS

Exemplary embodiments of the invention are schematically represented in the drawings and will be explained in more detail below. In the drawings.

DETAILED DESCRIPTION OF THE EXEMPLARY EMBODIMENTS

Figure 1:
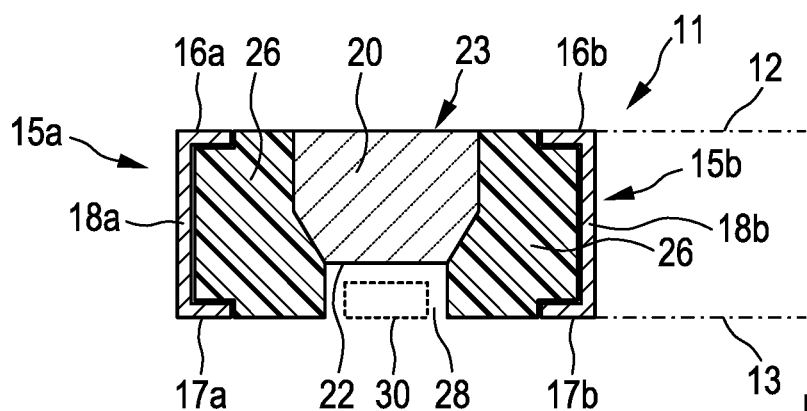
FIG. 1 shows a sectional representation through a sensor element device according to the invention in a first configuration of the invention.

FIG. 1 shows a sensor element device 11 according to the invention shown in side view, or in lateral section. The sensor element device 11 comprises an upper side 12 and a lower side 13, each of which is represented here in extension by dots and dashes. The upper side 12 and lower side 13 extend substantially in a plane.

The sensor element device 11 is produced as an integrated component, and comprises a sensor element 15a on the left and a sensor element 15b on the right. The sensor element 15a comprises an upper angle section 16a and a lower angle section 17a. A side part 18a extends between these. The right sensor element 15b is configured identically with an upper angle section 16b, a lower angle section 17b and a side part 18b between them. The right sensor element 15b is arranged mirror-symmetrically with respect to the left sensor element 15a. The angle sections 16 and 17 are each approximately at a right angle to the side parts 18, and may in practice also be configured to be more rounded. As may be seen, the upper side and lower side of the upper angle sections 16 respectively extend precisely in the plane of the upper side 12. In a similar way, the upper side and lower side of the lower angle sections 17 extend precisely in the plane of the lower side 13. While the angle sections 16 and 17 are configured so to speak two-dimensionally without an interruption or break, the situation may be different for the side parts 18, particularly in order to assist an injection-molding process, or injection. This will be discussed in more detail below.

Provided in the central region of the sensor element device 11, there is a light guide 20 consisting of light-transmissive material, which may advantageously be either fully transparent or slightly opaque. By such an opaque configuration, the illumination in transmission, and therefore also a luminous display resulting therefrom, may be rendered more uniform, even though the luminous intensity is reduced somewhat. The light guide 20 comprises an input region 22 at the bottom and an emission region 23 at the top. It is enclosed by light-nontransmissive shielding material 26, which is shown above all by the plan view of the sensor element device 11 in FIG. 2. This material fully encloses the light guide 20 on all four sides, and it possibly reaches respectively as far as the plane of the lower side 13. Below the light guide 20, or the input region 22, a recess 28 is thereby formed, in which an LED 30 indicated by dashes may be arranged for the luminous display.

The shielding material 26 and the light guide 20 are advantageously produced together by an injection-molding method. Advantageously, the shielding material 26 may in this case be injection-molded around the light guide 20, the light guide 20 already being present as a finished part before this. Subsequently, the sensor elements 15a and 15b may be laterally applied, or fastened, for example latched, clamped or clipped. In another configuration, it is possible for the light guide 20 and the sensor elements 15a and 15b to be introduced into an injection mold and then to be injection-molded around with the shielding material 26 to form a component. The shielding material 26 as well as the light guide 20 are advantageously electrically insulating.

It may be seen from FIG. 1 that the emission region 23 and the upper side of the shielding material 26 likewise do not protrude beyond the plane of the upper side 12, or extend therein. In a similar way, the shielding material 26 extends on its lower side in the plane of the lower side 13 of the entire sensor element device 11. Because of the recess 28, the input region 22 of the light guide 20 is significantly higher here.

Figure 2:
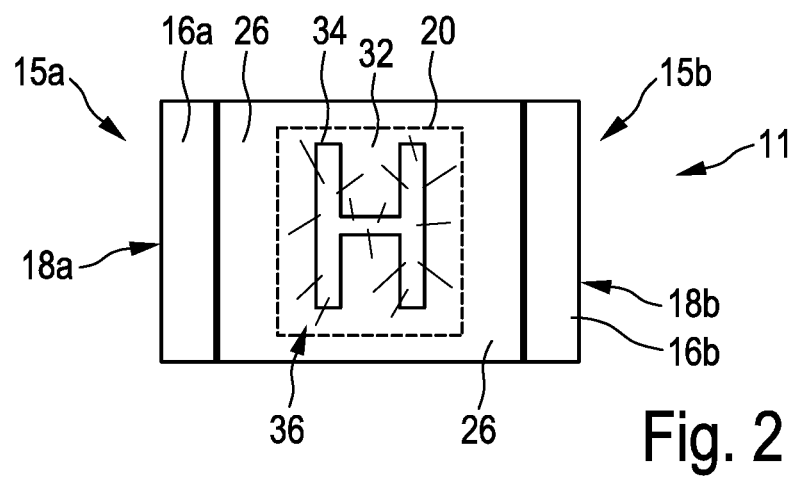
FIG. 2 shows a plan view of the sensor element device of FIG. 1.

The plan view of the sensor element device 11 in FIG. 2 reveals the way in which the sensor elements 15a and 15b form a certain area with the upper angle sections 16a and 16b, or two separate areas, which are electrically connected together in an operating device. Even if their area seems small, it is nevertheless enough to form a sufficient area for a capacitive sensor element formed therefrom for a capacitive touch switch. This, however, is known per se to the person skilled in the art. Since an advantageous length of a sensor element device lies between 5 mm and 15 mm, and a width between 3 mm and 9 mm, both upper angle sections 16a and 16b, and therefore also both sensor elements, are generally covered when a finger is placed onto a contact surface.

In the plan view, the light guide 20 is represented by dashes. It is covered at the top by a thin but light-nontransmissive coating 32. This may also cover the entire upper side of the shielding material 26, and possibly also an upper side of the upper angle sections 16. This coating 32 is configured in such a way that a symbol segment 34 may be excavated by a laser in a manner known per se, here as "H", for example for a hot display. No coating is thus provided in this symbol segment 34, so that light can emerge from the light guide 20 at the emission region 23. A luminous display 36 having a luminous or illuminated "H" is thus provided.

It is also readily conceivable for only one of the two sensor elements respectively represented to be provided, i.e. only on one side. Likewise, a sensor element may also so to speak be bent once or two times around the corner on an outer side of the sensor element device 11, which points into the plane of the drawing or out from the plane of the drawing. It may also be seen from FIGS. 1 and 2 that the entire sensor element device 11 has a cuboid shape, or block shape.

A coating 32 on the upper side 12 of the sensor element device 11 should advantageously not be too thick. It may optionally be calculated in terms of thickness so that it is at the same height on the upper side of the light guide 20 and of the shielding material 26 as the upper sides of the upper angle sections 16. As an alternative, it may also overlap these, or extend on them, in order to be used as a type of scratch protection so that the metallic sensor elements 15 do not bear on the lower side of a cooktop plate 48, which usually consists of glass ceramic, and scratch it.

Figure 3:
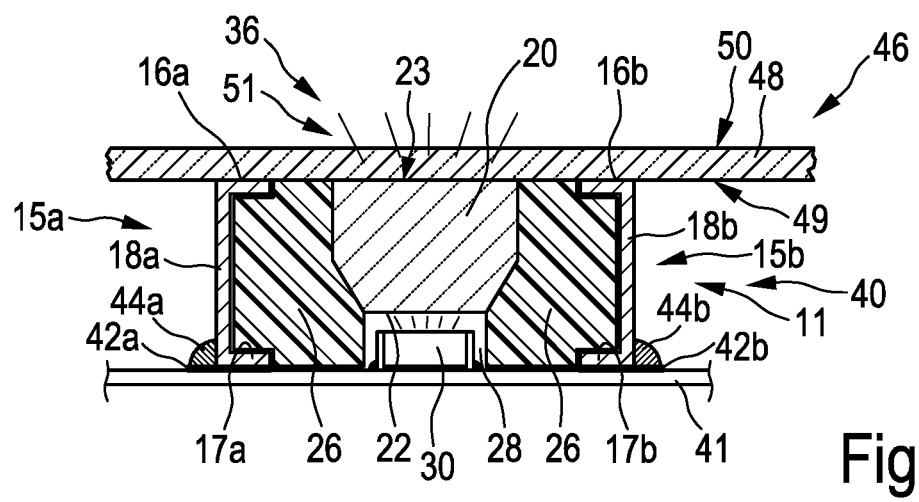
FIG. 3 shows a side view of an operating device according to the invention having an aforementioned sensor element device, which is integrated in a cooktop.

FIG. 3 shows the way in which the sensor element device 11 of FIGS. 1 and 2 is integrated into an operating device 40. The operating device 40 comprises a printed circuit board 41 having two contact fields 42*a* and 42*b* at a distance from one another. Conductive tracks for electrical connection are not represented. A sensor element device 11 bears on these contact fields 42 and is soldered to the lower angle sections 17*a* and 17*b* as well as to a small part of the lower regions of the side parts 18*a* and 18*b* by means of soldering tin 44*a* and 44*b*. This is advantageously carried out in an SMD process in such a way that the sensor element device 11 is placed by an SMD fitting machine on the prepared printed circuit board 41. There are then already small amounts of soldering tin 44*a* and 44*b* on the contact fields 42*a* and 42*b*. Furthermore, a conventional SMD adhesive spot for mechanically fixing may mechanically hold the sensor element device 11 after its placement or fitting until it is not only electrically connected but also permanently mechanically fastened by means of the soldering tin 44*a* and 44*b*. In a similar way, the LED 30 is fastened as an SMD component on contact fields (not represented) on the printed circuit board 41.

The operating device 40 comprises an operating surface at the top. A cooktop plate 48 of a cooktop 46, into which the operating device 40 is integrated, is used for this. The cooktop plate 48 comprises a lower side 49 and an upper side 50. Formed on the upper side 50 of the sensor element device 11, there is a touch surface 51 which, so to speak, is the place where the capacitive touch switch can be actuated by placement of a finger of a person operating it. The cooktop plate 48 is also light-transmissive, so that light from the LED 30 can shine through and, optionally, it advantageously forms a particular luminous display 36 with a symbol shape similar to FIG. 2. This is also known per se from similar sensor element devices.

Advantageously, although the cooktop 46 comprises only a single operating device 40, this has, however, a plurality or a multiplicity of sensor element devices 11, for example between five and fifty, on its printed circuit board 41. All the sensor element devices 11 are placed with their upper side on the lower side 49 of the cooktop plate 48, so that exact and consistent allocation of the upper angle sections 16 to the cooktop plate 48 and the upper side 50 is obtained.

Figure 4:
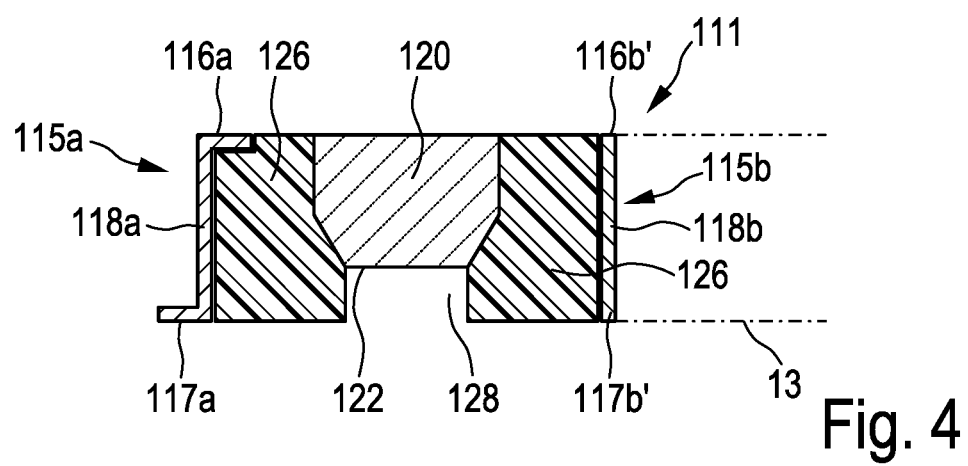
FIG. 4 shows a variant of an operating device similar to that of FIG. 1 in a sectional representation.

FIG. 4 represents a variant of a further sensor element device 111 according to the invention. In accordance with FIG. 1, it comprises a light guide 120 and shielding material 126 around the latter. A recess 128 for an LED is provided at the bottom. Provided on the left, there is a first configuration of an alternative sensor element 115*a* having a bent upper angle section 116*a* and a side part 118*a*, which correspond to FIG. 1. The lower angle section 117*a*, however, is bent outward rather than inward. This may possibly facilitate fastening or electrical contacting. With the aid of this, it is also readily conceivable that, irrespective of the configuration of the lower angle section 117*a*, the upper angle section 116*a* could be similarly bent outward, i.e. away from the sensor element device 111.

The right sensor element 115*b* is again configured differently. Here, only a side part 118*b* is actually provided, and angle sections are not provided at the top or bottom. The sensor element, or side part, may thus generally be flat, in particular without sections or parts which stand out or are bent. Provided at the bottom, there is a lower edge 117*b'* of the side part 118*b*, which is sufficient for electrical contact by means of SMD soldering. This may lap laterally onto the outer side of the side part 118*b* in the lower region. At the top, only a side edge 116*b'* of the side part 118*b* is likewise provided, so that here an area for a capacitive sensor element is essentially formed only by the area of this side edge, or only consists thereof. Depending on the material thickness of the side part 118*b*, this leads to a very small area for the capacitive sensor element. The result of this is the capacitive touch switch thereby produced possibly being not very sensitive, or rather susceptible to error. However, this may be compensated for well by correspondingly suitable connection and control and evaluation. Such sensor elements 115*b* may naturally be produced very easily since they do not have any angling, and they may also be used relatively easily in an injection-molding method for producing the sensor element device 111.

It may respectively be seen from FIGS. 1 and 4 that no part of the sensor element device stands out beyond the plane of the upper side or the plane of the lower side. It is, however, possible to fasten the sensor element device well and reliably on a component carrier or the printed circuit board 41 by means of SMD soldering.

The invention claimed is:

1. A sensor element device for an operating device having a luminous display, wherein said sensor element device comprises a sensor element for a capacitive touch switch of said operating device, said sensor element device comprising: a light guide for said luminous display, said light guide consisting of light-transmissive material, said light guide comprising an input region for light and an emission region for light,
    shielding material which encloses said light guide except for said input region and said emission region, said shielding material being light-nontransmissive in combination with said light guide,
    at least one metallic sensor element, said metallic sensor element consisting of at least one metal part,
    wherein:
    said sensor element device comprises a lower side and an upper side,
    said sensor element extends from said lower side of said sensor element device to said upper side of said sensor element device,
    said sensor element device forms an integrated module with said light guide, said shielding material and said sensor element,
    said sensor element projects as far as a plane of said lower side of said sensor element device and at least partially defines said plane of said lower side,
    no part of said sensor element device protrudes downward beyond said lower side of said sensor element device or beyond said sensor element.

2. The sensor element device as claimed in claim 1, wherein said sensor element does not adjoin said light guide or extends separate from said light guide.

3. The sensor element device as claimed in claim 1, wherein said sensor element extends on one side of said sensor element device.

4. The sensor element device as claimed in claim 1, wherein said sensor element extends on at least two sides of said sensor element device.

5. The sensor element device as claimed in claim 4, wherein said sensor element extends on at least two sides of said sensor element device, on mutually adjacent sides or on opposite sides, in the former case a single sensor element being provided, which is bent or angled, and in the latter case two sensor elements being provided, which are at a distance from one another and separate.

6. The sensor element device as claimed in claim 1, wherein said sensor element device is produced by a multicomponent injection-molding method, said at least one sensor element being injection-molded on or in, or at least partially around.

7. The sensor element device as claimed in claim 1, wherein said sensor element is provided on an outer side, and is exposed on said outer side.

8. The sensor element device as claimed in claim 1, wherein said sensor element is bent in a region of said lower side of said sensor element device onto said lower side.

9. The sensor element device as claimed in claim 8, wherein said sensor element is bent in a region of said lower side of said sensor element device onto said lower side and is bent with an angle section which bears with one outer side on said sensor element device or on said shielding material and with another outer side extends in said plane of said lower side of said sensor element device, or forms a part of said lower side, and at least partially defines said plane of said lower side.

10. The sensor element device as claimed in claim 1, wherein said sensor element is bent in an upper region, which extends in a surface of said upper side of said sensor element device, toward a central region of said upper side.

11. The sensor element device as claimed in claim 10, wherein said sensor element is bent approximately at a right angle, and has a separation from the light guide.

12. The sensor element device as claimed in claim 11, wherein a light-nontransmissive covering or coating is provided on said upper side of said sensor element device, or of said light guide.

13. The sensor element device as claimed in claim 12, wherein a light-nontransmissive covering or coating is configured in such a way that it can be removed by a laser in order to excavate segments for transmission of light from said emission region of said light guide for said luminous display.

14. The sensor element device as claimed in claim 1, wherein precisely one said sensor element device forms precisely one said capacitive touch switch.

15. An operating device having a capacitive touch switch and a sensor element device as claimed in claim 1 for the capacitive touch switch, wherein the operating device comprises an operating surface, below which operating surface said sensor element device is arranged, said capacitive sensor element or one of said sections of said capacitive sensor element bearing on a lower side of said operating surface.

16. The operating device as claimed in claim 15, wherein a component carrier is provided on which said sensor element device is arranged and electrically connected, said component carrier comprising on its upper side at least one contact field, on which said capacitive sensor element bears and is mechanically and electrically connected.

17. An electrical appliance having an operating device as claimed in claim 15, wherein said electrical appliance is an electric cooktop having a cooktop plate, a part of said cooktop plate forming said operating surface, said operating device being arranged below said cooktop plate and said operating device comprising a multiplicity of said sensor element devices.

* * * * *